(12) United States Patent
Chen (10) Patent No.: US 11,810,790 B2
(45) Date of Patent: Nov. 7, 2023

(54) METHOD FOR FORMING SEMICONDUCTOR STRUCTURE

(71) Applicants: Semiconductor Manufacturing International (Shanghai) Corporation, Shanghai (CN); Semiconductor Manufacturing International (Beijing) Corporation, Beijing (CN)

(72) Inventor: Shu Chen, Shanghai (CN)

(73) Assignees: Semiconductor Manufacturing International (Shanghai) Corporation, Shanghai (CN); Semiconductor Manufacturing International (Beijing) Corporation, Beijing (CN)

(*) Notice: Subject to any disclaimer, the term of this patent is extended or adjusted under 35 U.S.C. 154(b) by 225 days.

(21) Appl. No.: 17/511,919

(22) Filed: Oct. 27, 2021

(65) Prior Publication Data

US 2022/0139715 A1 May 5, 2022

(30) Foreign Application Priority Data

Oct. 30, 2020 (CN) .......................... 202011188191.0

(51) Int. Cl.
 *H01L 21/308* (2006.01)

(52) U.S. Cl.
 CPC ................ *H01L 21/3088* (2013.01)

(58) Field of Classification Search
 CPC .................................................. H01L 21/3088
 See application file for complete search history.

(56) References Cited

U.S. PATENT DOCUMENTS

2014/0083972 A1* 3/2014 Oyama ............... H01B 13/003
216/13

* cited by examiner

*Primary Examiner* — Walter H Swanson
(74) *Attorney, Agent, or Firm* — Crowell & Moring, LLP (57) ABSTRACT

A method for forming a semiconductor structure is provided. In one form, a method includes: providing a base, where the base includes first regions and a second region located between the first regions; forming a pattern definition layer on the base; forming discrete mask layers on the pattern definition layer, the mask layers and the base defining openings, where openings of the first regions serve as first openings, and an opening of the second region serves as a second opening; forming a filling layer in the second opening; and etching, using the mask layers and the filling layer as masks, the pattern definition layer exposed from the first openings, to form target patterns. In embodiments and implementations of this application, the filling layer is formed between the mask layers of the second region, to obtain a mask that finally etches the pattern definition layer, so that the formed target patterns meet process requirements, which is conducive to improving electrical performance of the semiconductor structure.

12 Claims, 8 Drawing Sheets

METHOD FOR FORMING SEMICONDUCTOR STRUCTURE

RELATED APPLICATIONS

The present application claims priority to Chinese Patent Appln. No. 202011188191.0, filed Oct. 30, 2020, the entire disclosure of which is hereby incorporated by reference.

BACKGROUND

Technical Field

Embodiments and implementations of the present disclosure relate to the field of semiconductor manufacturing, and in particular, to a method for forming a semiconductor structure.

Related Art

Currently, as semiconductor technologies develop towards a small line width and a high integration level, higher requirements are also put forward on a photolithography process. Particularly, when a dimension decreases to be below 28 nanometers, pitches between patterns are increasingly small. When patterns on a mask layout are transferred to a wafer, the impacts of optical interference and diffraction effects on neighboring patterns result in an optical proximity effect, for example, line-end shortening, line-end bridging, line width variations, or line corner rounding.

Specifically, in some semiconductor element designs, different parts of a same chip usually have some densely distributed patterns (dense patterns) and some isolated patterns (iso patterns) respectively. When the same chip has iso and dense pattern regions simultaneously, due to an optical proximity effect, line widths with a same target dimension of the iso and dense pattern regions have different actual dimensions after the chip is transferred to a wafer, that is, a defect of line width variations.

Usually, when patterns on a mask layout are transferred to a wafer, to improve formation quality of the patterns, bars are formed between the patterns on the mask layout. The density of local patterns may be optimized using the bars, thereby improving the contrast of the patterns, so that the formation quality of the patterns on the wafer can be improved.

SUMMARY

A problem to be addressed in embodiments and implementations of the present disclosure is to provide a method for forming a semiconductor structure to improve electrical performance of a device.

To address the foregoing problem, the present disclosure provides forms of a method for forming a semiconductor structure. In one form, a method for forming a semiconductor structure includes: providing a base, where the base includes first regions and a second region located between the first regions; forming a pattern definition layer on the base; forming discrete mask layers on the pattern definition layer, the mask layers and the base defining openings, where openings of the first regions serve as first openings, and an opening of the second region serves as a second opening; forming a filling layer in the second opening; and etching, using the mask layers and the filling layer as masks, the pattern definition layer exposed from the first openings, to form target patterns.

In some implementations, in the step of forming discrete mask layers on the pattern definition layer, an extension direction parallel to a surface of the base and perpendicular to the mask layers is used as a lateral direction; and the step of forming a filling layer in the second opening includes: conformally covering the mask layers and the pattern definition layer exposed from the mask layers with a filling material layer, double of a thickness of the filling material layer being greater than a lateral dimension of the second opening; and removing the filling material layer at the bottom of the first openings and the filling material layer located at the top of the mask layers, the remaining filling material layer located in the second opening serving as the filling layer.

In some implementations, the filling material layer is formed using an atomic layer deposition (ALD) process or a chemical vapor deposition (CVD) process.

In some implementations, the filling material layer at the bottom of the first openings and the filling material layer located at the top of the mask layers are removed using a blanket dry etching process.

In some implementations, in the step of forming a filling layer in the second opening, filling spacers are further formed on side walls of the first openings; and in the step of etching, using the mask layers and the filling layer as masks, the pattern definition layer exposed from the first openings, to form target patterns, the pattern definition layer is further etched by using the filling spacers as masks.

In some implementations, in the step of forming discrete mask layers on the pattern definition layer, there is one second opening, or there is a plurality of second openings.

In some implementations, the step of forming discrete mask layers on the pattern definition layer includes: forming a mask material layer on the pattern definition layer; forming a photoresist material layer on the mask material layer; providing a mask layout, the mask layout including first mask regions and a second mask region located between the first mask regions, the first mask regions having first patterns, and the second mask region having a second pattern; patterning the photoresist material layer according to the mask layout, to form photoresist layers; and etching the mask material layer by using the photoresist layers as masks, to form the mask layers, the first openings corresponding to the first patterns, and the second opening corresponding to the second pattern.

In some implementations, in the step of providing a mask layout, an extension direction perpendicular to the second pattern is used as a lateral direction, and a lateral dimension of the second pattern is less than lateral dimensions of the first patterns.

In some implementations, in the step of providing a mask layout, a ratio of the lateral dimension of the second pattern to the lateral dimensions of the first patterns is ⅓ to 1.

In some implementations, in the extension direction of the second pattern, the second pattern is a continuous pattern. In some implementations, an extension direction of the first patterns is the same as the extension direction of the second pattern.

In some implementations, dimensions of the first patterns in the extension direction are less than or equal to a dimension of the second pattern in the extension direction.

Compared with the prior art, technical solutions of embodiments and implementations of the present disclosure have at least the following advantages:

In forms of a method for forming a semiconductor structure provided in the present disclosure, a filling layer is formed between the mask layers of the second region, and the pattern definition layer is etched subsequently using the mask layers and the filling layer as masks, to form target patterns. In embodiments and implementations of this application, the filling layer is formed between the mask layers of the second region, to obtain a mask that finally etches the pattern definition layer, so that the formed target patterns meet process requirements, which is conducive to improving electrical performance of the semiconductor structure.

In some implementations, the step of forming discrete mask layers on the pattern definition layer includes: forming a mask material layer on the pattern definition layer; forming a photoresist material layer on the mask material layer; providing a mask layout, the mask layout including first mask regions and a second mask region located between the first mask regions, the first mask regions having first patterns, and the second mask region having a second pattern; and patterning the photoresist material layer according to the mask layout, to form photoresist layers, and etching the mask material layer by using the photoresist layers as masks, to form the mask layers, the first patterns corresponding to the first openings, and the second pattern corresponding to the second opening. In the mask layout provided in embodiments and implementations of the present disclosure, an extension direction perpendicular to the second pattern is used as a lateral direction, and a lateral dimension of the second pattern is relatively large, which reduces manufacturing difficulty and manufacturing costs of the mask layout, and is conducive to improving formation efficiency of the mask layer. In addition, in the process of forming photoresist layers according to the mask layout, the second pattern can optimize the pattern density of the first patterns, and improve the contrast of the first patterns, so that line width roughness (LWR) and line edge roughness (LER) of side walls of the photoresist layers are relatively small, and LWR and LER of side walls of the mask layers formed by etching the mask material layer using the photoresist layers as masks are relatively small, so that LWR and LER of side walls of the target patterns formed by etching the pattern definition layer using the mask layers as masks are relatively small. Although in the step of forming the mask layers according to the mask layout, the second pattern is transferred to form the second opening, by forming the filling layer in the second opening, the mask that finally etches the pattern definition layer can still be obtained, so that the target patterns formed by using the mask layers and the filling layer as masks meet process requirements, and due to the fact that the LWR and the LER of the side wall of the second opening are relatively small, formation quality of the target patterns is relatively good, which is conducive to improving electrical performance of the semiconductor structure.

DETAILED DESCRIPTION

Current semiconductor devices have a need for improved performance. Some reasons for a poor performance of semiconductor devices are analyzed with reference to a method for forming a semiconductor structure.

FIG. 1 to FIG. 4 are schematic structural diagrams corresponding to steps in a first method for forming a semiconductor structure.

Figure 1:
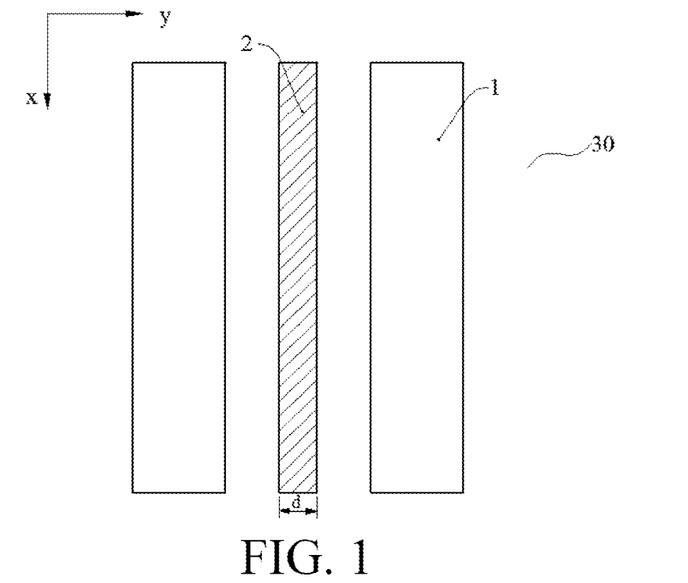
FIG. 1 to FIG. 4 are schematic structural diagrams corresponding to steps in a first method for forming a semiconductor structure.

As shown in FIG. 1, a mask layout 30 is provided, where the mask layout 30 includes: spaced first patterns 1, the first patterns 1 extending in a first direction x; and a second pattern 2, located between the first patterns 1, the second pattern 2 extending in the first direction x, and spaced apart from the first patterns 1 in a second direction y, and the second direction y being perpendicular to the first direction x.

Figure 2:
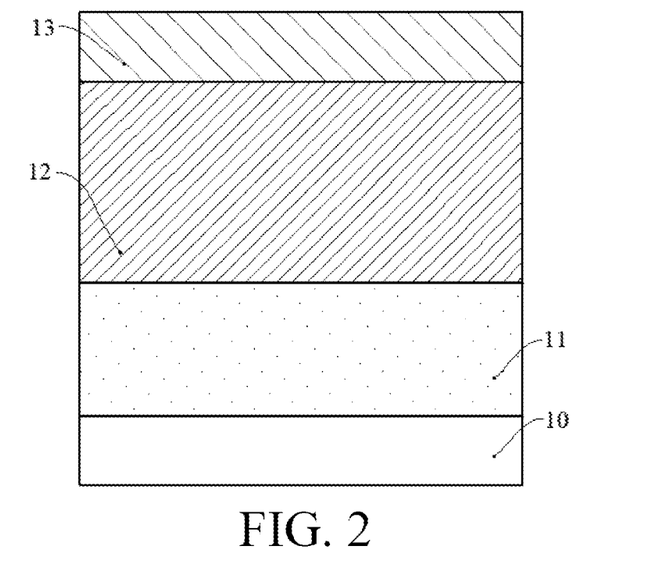

As shown in FIG. 2, a base 10 is provided, a pattern definition layer 11 is formed on the base 10, a mask material layer 12 is formed on the pattern definition layer 11, and a photoresist material layer 13 is formed on the mask material layer 12.

Figure 3:
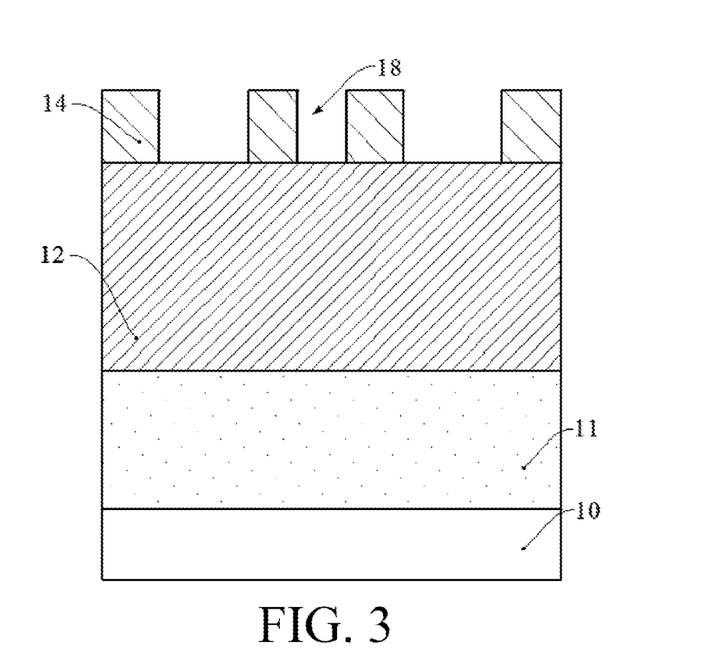

As shown in FIG. 3, the photoresist material layer 13 is exposed according to the mask layout 30, to form photoresist layers 14.

Figure 4:
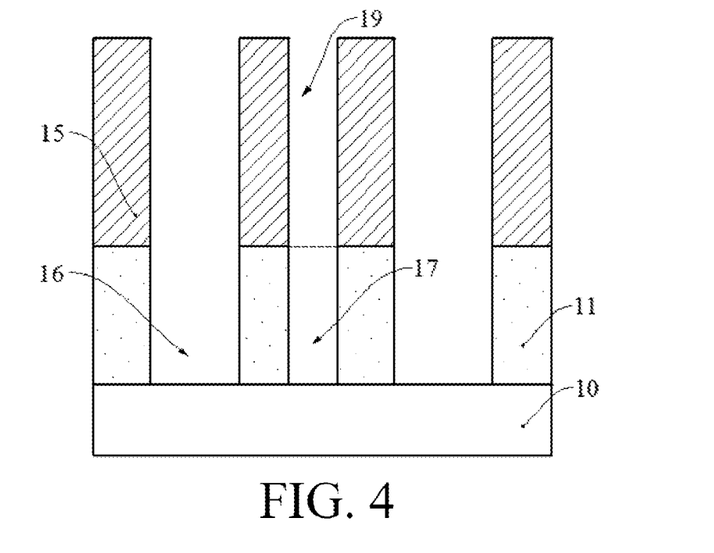

As shown in FIG. 4, the mask material layer 12 is etched using the photoresist layers 14 as masks, to form mask layers 15; and the pattern definition layer 11 is etched using the mask layers 15 as masks, to form target patterns 16.

In the mask layout 30, the first patterns 1 are used for forming the target patterns 16 on the base 10, and the second pattern 2 is an auxiliary pattern. In the process that the photoresist material layer 13 is exposed according to the mask layout 30, to form photoresist layers 14, under the action of optical proximity correction (OPC), the second pattern 2 is not easy to be transferred to the photoresist layers 14, and the second pattern 2 is used for optimizing the pattern density of the first patterns 1, and improving the contrast of the first patterns 1, so that line width roughness (LWR) and line edge roughness (LER) of side walls of the formed photoresist layers 14 are relatively small. Correspondingly, LWR and LER of side walls of the mask layers 15 formed by etching the mask material layer 12 using the photoresist layers 14 as masks are relatively small, so that LWR and LER of side walls of the target patterns 16 formed by etching the pattern definition layer 11 by using the mask layers 15 as masks are relatively small, and formation quality of the target patterns 16 is relatively good.

With the development of the semiconductor process, the integration level of semiconductor structures becomes increasingly high. Correspondingly, in the second direction y, a dimension d (as shown in FIG. 1) of the second pattern 2 becomes increasingly small, and it is easy for the second pattern 2 to form grooves 18 in the photoresist layers 14. In the process that the mask material layer 12 is etched using the photoresist layers 14 as masks, to form mask layers 15, interference openings 19 are easy to be formed in the mask layers 15, and in the process that the pattern definition layer 11 is etched using the mask layers 15 as masks, to form target patterns 16, interference patterns 17 are easy to be formed according to the interference openings 19.

Figure 5:
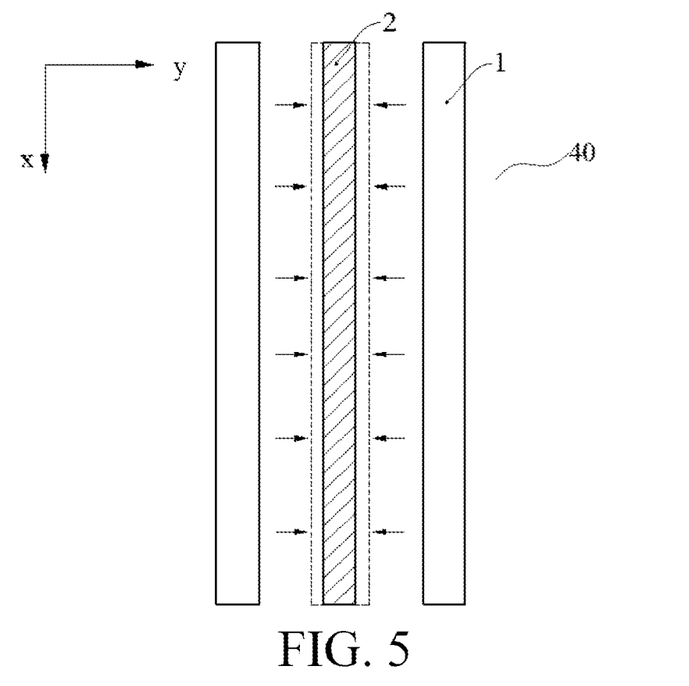
FIG. 5 and FIG. 6 are schematic structural diagrams corresponding to steps in a second method for forming a semiconductor structure.
Figure 6:
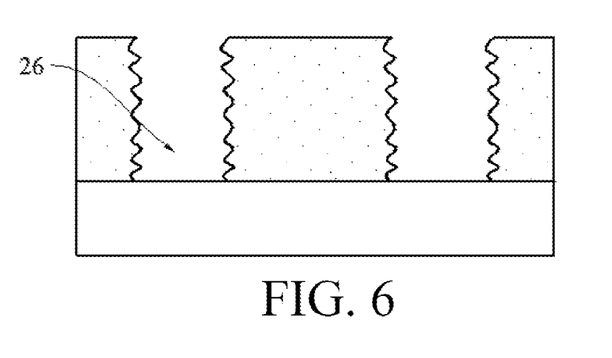

FIG. 5 and FIG. 6 are schematic structural diagrams corresponding to steps in a second method for forming a semiconductor structure. The second method for forming a semiconductor structure is an improvement on the first method for forming a semiconductor structure.

FIG. 5 is an improved mask layout 40, both first patterns 1 and second pattern 2 extend in a first direction x, the second pattern 2 and the first patterns 1 are spaced apart in a second direction y, and the second direction y is perpendicular to the first direction x. To make the second pattern 2 not easy to be transferred to photoresist layers, a dimension of the second pattern 2 is decreased in the second direction y (a dimension indicated by dotted lines in the figure is decreased to a dimension indicated by solid lines). In the process that the photoresist material layer is exposed according to the mask layout 40, to form photoresist layers, although the second pattern 2 is not easy to be transferred to the photoresist layers, in the process of forming the photoresist layers, an effect of optimizing the pattern density of the first patterns 1 by the second pattern 2 is relatively poor, and LWR and LER of side walls of the photoresist layers are relatively large. Correspondingly, LWR and LER of side walls of mask layers formed by using the photoresist layers as masks are relatively large. As a result, LWR and LER of side walls of target patterns 26 formed by using the mask layers as masks are relatively large, and formation quality of the target patterns 26 is relatively poor.

Figure 7:
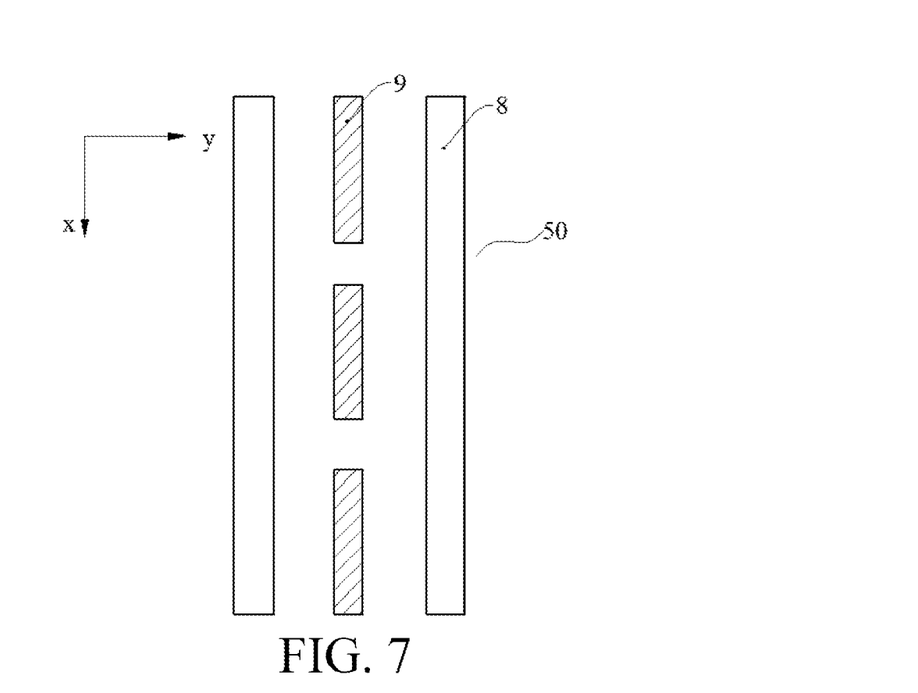
FIG. 7 is a schematic structural diagram of a mask layout in a third method for forming a semiconductor structure.

FIG. 7 is a schematic structural diagram of a mask layout in a third method for forming a semiconductor structure. The third method for forming a semiconductor structure is an improvement on the first method for forming a semiconductor structure.

FIG. 7 is an improved mask layout 50, both first patterns 8 and a second pattern 9 extend in a first direction x, the second pattern 9 and the first patterns 8 are spaced apart in a second direction y, and the second direction y is perpendicular to the first direction x. To make the second pattern 9 not easy to be transferred to photoresist layers, in the first direction x, the second pattern 9 is broken. In the process that the photoresist material layer is exposed according to the mask layout 50, to form photoresist layers, although the second pattern 9 is not easy to be transferred to the photoresist layers, in the process of forming the photoresist layers, the pattern density of the entire first patterns 8 cannot be optimized by the second pattern 9, and LWR and LER of side walls of the photoresist layers are relatively large. Correspondingly, LWR and LER of side walls of mask layers formed by using the photoresist layers as masks are relatively large. As a result, LWR and LER of target patterns formed by using the mask layers as masks are relatively large, and formation quality of the target patterns is relatively poor.

To address the technical problem, the present disclosure provides methods for forming a semiconductor structure. In one form, a method for forming a semiconductor structure includes: providing a base, where the base includes first regions and a second region located between the first regions; forming a pattern definition layer on the base; forming discrete mask layers on the pattern definition layer, the mask layers and the base defining openings, where openings of the first regions serve as first openings, and an opening of the second region serves as a second opening; forming a filling layer in the second opening; and etching, using the mask layers and the filling layer as masks, the pattern definition layer exposed from the first openings, to form target patterns.

In implementations of the method for forming a semiconductor structure of the present disclosure, a filling layer is formed between the mask layers of the second region, and the pattern definition layer is etched subsequently using the mask layers and the filling layer as masks, to form target patterns. In embodiments and implementations of this application, the filling layer is formed between the mask layers of the second region, to obtain a mask that finally etches the pattern definition layer, so that the formed target patterns meet process requirements, which is conducive to improving electrical performance of the semiconductor structure.

In an optional solution, the step of forming discrete mask layers on the pattern definition layer includes: the step of forming discrete mask layers on the pattern definition layer including: forming a mask material layer on the pattern definition layer; forming a photoresist material layer on the mask material layer; providing a mask layout, the mask layout including first mask regions and a second mask region located between the first mask regions, the first mask regions having first patterns, and the second mask region having a second pattern; and patterning the photoresist material layer according to the mask layout, to form photoresist layers, and etching the mask material layer using the photoresist layers as masks, to form the mask layers, the first patterns corresponding to the first openings, and the second pattern corresponding to the second opening. In the mask layout provided in embodiments and implementations of the present disclosure, an extension direction perpendicular to the second pattern is used as a lateral direction, and a lateral dimension of the second pattern is relatively large, which reduces manufacturing difficulty and manufacturing costs of the mask layout, and is conducive to improving formation efficiency of the mask layer. In addition, in the process of forming photoresist layers according to the mask layout, the second pattern can optimize the pattern density of the first patterns, and improve the contrast of the first patterns, so that LWR and LER of side walls of the photoresist layers are relatively small, and LWR and LER of side walls of the mask layers formed by etching the mask material layer using the photoresist layers as masks are relatively small, so that LWR and LER of side walls of the target patterns formed by etching the pattern definition layer using the mask layers as masks are relatively small. Although in the step of forming the mask layers according to the mask layout, the second pattern is transferred to form the second opening, by forming the filling layer in the second opening, the mask that finally etches the pattern definition layer can still be obtained, so that the target patterns formed using the mask layers and the filling layer as masks meet process requirements, and due to the fact that the LWR and the LER of the side wall of the second opening are relatively small, formation quality of the target patterns is relatively good, which is conducive to improving electrical performance of the semiconductor structure.

To make the foregoing objectives, features, and advantages of embodiments and implementations of the present disclosure more clearly understood, specific embodiments and implementations of the present disclosure are described in detail below with reference to the drawings.

FIG. 8 to FIG. 16 are schematic structural diagrams corresponding to steps in one form of a method for forming a semiconductor structure according to the present disclosure.

Figure 8:
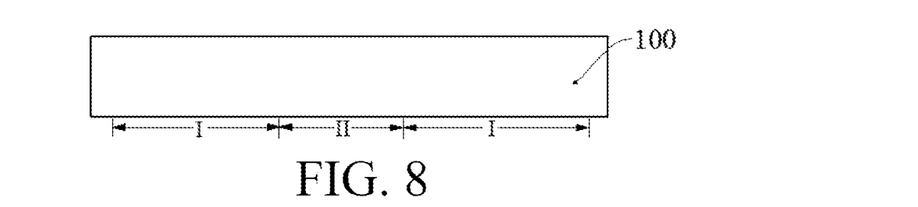
FIG. 8 to FIG. 16 are schematic structural diagrams corresponding to steps in one form of a method for forming a semiconductor structure according to the present disclosure.

Referring to FIG. 8, a base 100 is provided, and the base 100 includes first regions I and a second region II located between the first regions I.

The base 100 provides a process platform for subsequent formation of target patterns.

The first regions I are prepared for subsequent formation of first openings, and the second region II is prepared for subsequent formation of a second opening.

The base 100 may be correspondingly replaced with a material required by the target patterns according to process requirements.

In this form, a material of the base 100 is silicon. In other forms, the material of the base may alternatively include: germanium, silicon carbide, gallium arsenide, or indium gallium. The base may alternatively be a silicon base on an insulator or a germanium base on an insulator. Alternatively, the base includes: at least one of silicon nitride, silicon oxynitride, silicon carbide, silicon carbonitride, boron nitride, silicon boron nitride, or silicon carbon boron nitride. In some other forms, the material of the base may be further metal.

Figure 9:
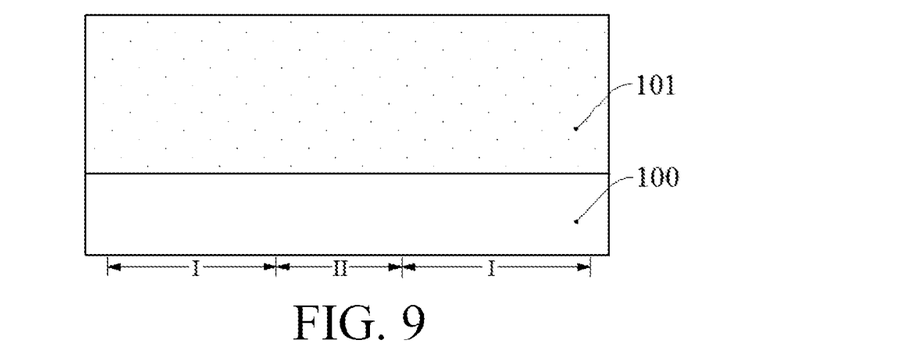

Referring to FIG. 9, a pattern definition layer 101 is formed on the base 100. The pattern definition layer 101 is prepared for subsequent formation of target patterns.

In this form, the target patterns are used for separating adjacent fins. Specifically, a material of the pattern definition layer 101 includes at least one of silicon, silicon germanium, germanium, silicon carbide, gallium arsenide, or indium gallium.

In this form, the material of the pattern definition layer 101 includes silicon.

In this form, the pattern definition layer 101 is formed using a selective epitaxy growth (SEG) process. A thin film obtained using the SEG process has high purity and few defects, which is conducive to improving formation quality of the pattern definition layer 101. LWR and LER of side walls of the fins formed subsequently through patterning of the pattern definition layer 101 are relatively small, so that formation quality of the subsequently formed fins is relatively good, which is conducive to improving electrical performance of the semiconductor structure.

In other forms, the target patterns may be further used for separating adjacent dummy gate structures, and the material of the pattern definition layer includes amorphous silicon. Correspondingly, the pattern definition layer is formed by using the SEG process.

In some other forms, the target patterns may be further trenches of to-be-formed interconnection structures, and the material of the pattern definition layer is a dielectric material, such as, a low-k dielectric material (which refers to a dielectric material having a relative dielectric constant greater than or equal to 2.6 and less than or equal to 3.9) or an ultra-low-k dielectric material (which refers to a dielectric material having a relative dielectric constant less than 2.6).

Figure 11:
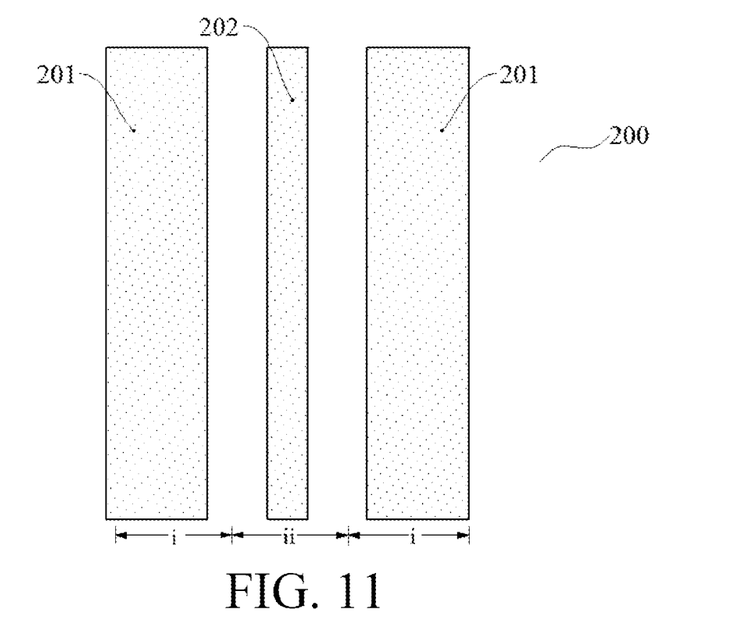
Figure 12:
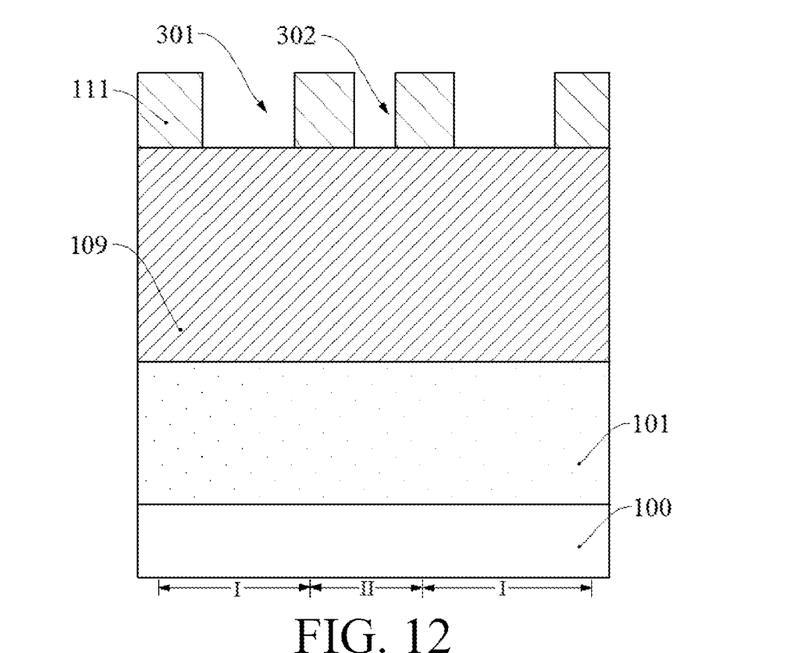
Figure 13:
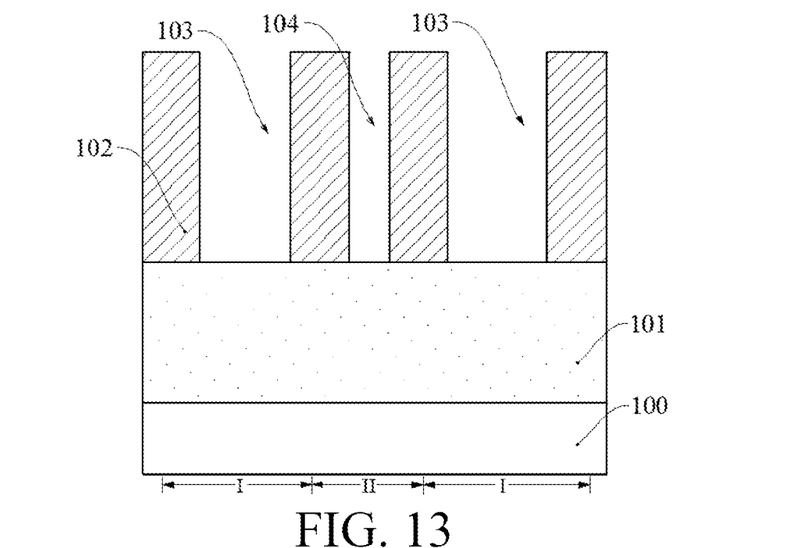

Referring to FIG. 10 to FIG. 13, discrete mask layers 102 are formed on the pattern definition layer 101 (as shown in FIG. 13), the mask layers 102 and the base 100 define openings, openings of the first regions I serve as first openings 103 (as shown in FIG. 13), and an opening of the second region II serves as a second opening 104 (as shown in FIG. 13).

Specifically, the pattern definition layer 101 is formed on the base 100, and in the step of forming the mask layers 102, the openings are defined by the pattern definition layer 101 and the mask layers 102.

The mask layers 102 are used as etching masks for etching the pattern definition layer 101, to form target patterns; and the second opening 104 provides process space for subsequent formation of a filling layer, and the first openings 103 expose the pattern definition layer 101, and are prepared for subsequent etching of the pattern definition layer 101, to form target patterns.

The mask layers 102 are materials that can function as masks and are easy to remove, so that when the mask layers 102 are removed subsequently, damage to the subsequently formed target patterns is reduced, which is conducive to improving formation quality of the target patterns.

Figure 10:
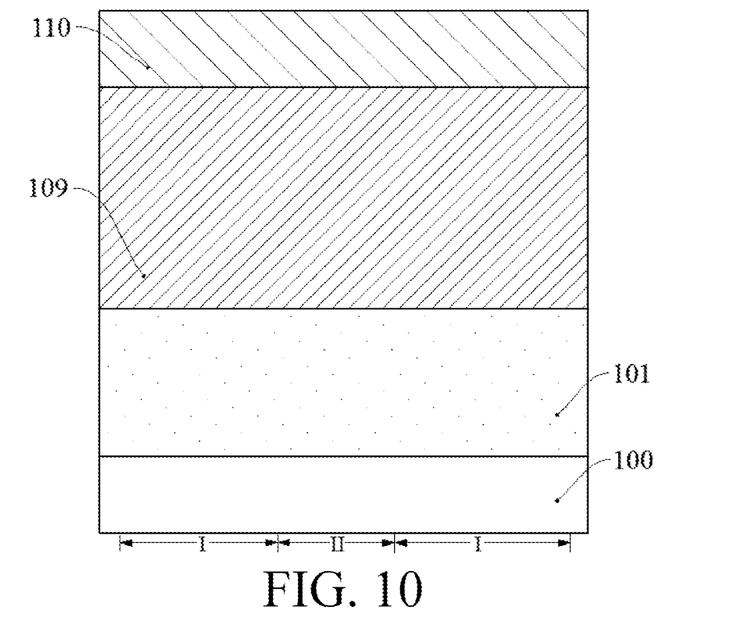

Specifically, the step of forming mask layers 102 on the pattern definition layer 101 includes:

as shown in FIG. 10, forming a mask material layer 109 on the pattern definition layer 101.

The mask material layer 109 is prepared for subsequent formation of the mask layers 102.

In this form, a material of the mask material layer 109 includes: at least one of silicon oxide, silicon nitride, silicon oxynitride, silicon carbide, silicon carbonitride, boron nitride, silicon boron nitride, or silicon carbon boron nitride.

Still referring to FIG. 10, a photoresist material layer 110 is formed on the mask material layer 109. The photoresist material layer 110 is subsequently patterned, to form photoresist layers.

In this form, the photoresist material layer 110 is formed using a spin on process.

It should be noted that, forms of the method for forming a semiconductor structure include: after the mask material layer 109 is formed, and before the photoresist material layer 110 is formed on the mask material layer 109, forming an organic material layer (not shown in the figure) on the mask material layer 109 and an anti-reflective coating (not shown in the figure) located on the organic material layer.

In this form, a material of the organic material layer includes an organic material, for example, one or more of an organic dielectric layer (ODL) material, a deep UV light absorbing oxide (DUO) material, and an advanced patterning film (APF) material.

A material of the anti-reflective coating includes: a dielectric anti-reflective coating (DARC) material or a bottom anti-reflective coating (BARC) material.

As shown in FIG. 11, the method for forming a semiconductor structure further includes: providing a mask layout 200, the mask layout 200 including first mask regions i and a second mask region ii located between the first mask regions i, the first mask regions i having first patterns 201, and the second mask region ii having a second pattern 202.

In the mask layout 200 provided in embodiments and implementations of the present disclosure, an extension direction perpendicular to the second pattern 202 is used as a lateral direction, and a lateral dimension of the second pattern 202 is relatively large, which reduces manufacturing difficulty and manufacturing costs of the mask layout 200, and is conducive to improving formation efficiency of the mask layout 200.

In the extension direction of the second pattern, the second pattern 202 is a continuous pattern. Compared with a case that in the extension direction of the second pattern, the second pattern is a discontinuous pattern, in a subsequent process of patterning the photoresist material layer 110 according to the mask layout 200, to form photoresist layers, the second pattern 202 can optimize the pattern density of the entire first patterns 201 more easily, and improve the contrast of the first patterns 201, which is conducive to decreasing LWR and LER of side walls of the subsequently formed photoresist layers.

In this form, the mask layout 200 refers to a layout file designed and formed by using an EDA tool. Generally, the layout file is a layout file verified by using design rule check (DRC).

In this form, a file format of the mask layout 200 is GDS. In other forms, file format of the layout may be further another format, such as, OASIS.

The mask layers are subsequently formed according to the mask layout 200, the first patterns 201 correspond to the first openings, and the second pattern 202 corresponds to the second opening.

In this form, an extension direction of the first patterns 201 is the same as an extension direction of the second pattern 202.

The extension direction of the first patterns 201 is the same as the extension direction of the second pattern 202, so that the second pattern 202 does not intersect with the first patterns 201. In the subsequent process that the photoresist material layer 110 is exposed according to the mask layout 200, to form photoresist layers 111, the second pattern 202 optimizes the pattern density of the first patterns 201, and improves the contrast of the first patterns 201, so that LWR and LER of side walls of the photoresist layers 111 are relatively small, and therefore LWR and LER of side walls of the first openings formed by etching the mask material layer 109 by using the photoresist layers 111 as masks are relatively small. Therefore, LWR and LER of the target patterns formed by etching the pattern definition layer 101 exposed from the first openings are relatively small, and formation quality of the target patterns is relatively good.

In this form, dimensions of the first patterns 201 in the extension direction are less than or equal to a dimension of the second pattern 202 in the extension direction.

The dimensions of the first patterns 201 in the extension direction are less than or equal to the dimension of the second pattern 202 in the extension direction, so that in the process that the photoresist material layer 110 is exposed according to the mask layout 200, to pattern the photoresist material layer 110, the second pattern 202 can optimize the pattern density of the entire first patterns 201, and improve the contrast of the first patterns 201, so that LWR and LER of side walls of the photoresist layers 111 are relatively small, and therefore LWR and LER of side walls of the first openings formed by etching the mask material layer 109 by using the photoresist layers 111 as masks are relatively small. Therefore, LWR and LER of the target patterns formed by etching the pattern definition layer 101 exposed from the first openings are relatively small, and formation quality of the target patterns is relatively good.

It should be noted that, in this form, there is one second pattern 202 between the first patterns 201. In other forms, there may alternatively be a plurality of second patterns between the first patterns. Compared with a case that there is one second pattern, when there are a plurality of second patterns, in the process of patterning the photoresist material layer according to the mask layout, to form photoresist layers, the contrast of the first patterns is better, so that LWR and LER of side walls of the formed photoresist layers are relatively small.

In the step of providing a mask layout 200, an extension direction perpendicular to the second pattern 202 is used as a lateral direction, and a lateral dimension of the second pattern 202 is less than lateral dimensions of the first patterns 201. An extension direction parallel to a surface of the base 100 and perpendicular to the mask layers is used as a lateral direction subsequently, and correspondingly, a lateral dimension of the second opening is less than lateral dimensions of the first openings.

In the method for forming a semiconductor structure, a filling layer is formed in the second opening subsequently, and the step of forming a filling layer includes: conformally covering the mask layers and the pattern definition layer 101 exposed from the mask layers with filling material layers; and removing the filling material layer at the bottom of the first openings and the filling material layer located at the top of the mask layers, the remaining filling material layer located in the second opening serving as the filling layer. If the lateral dimension of the second opening is greater than or equal to the lateral dimensions of the first openings, when the filling layer is formed in the second opening, the first openings are also filled with filling material layers, that is to say, the mask layers, the filling layer, and the filling material layers in the first openings completely cover the pattern definition layer 101. As a result, the pattern definition layer 101 cannot be subsequently etched by using the mask layers and the filling layer as masks, to form target patterns.

It should be noted that, in the step of providing a mask layout 200, a ratio of the lateral dimension of the second pattern 202 to the lateral dimensions of the first patterns 201 should not be excessively large or excessively small. If the ratio is excessively large, in the subsequent process of exposing the photoresist material layer 110 according to the mask layout 200, to pattern the photoresist material layer 110, the second pattern 202 has relatively large impacts on the first patterns 201, causing a relatively large process variation band (PV band), and the second pattern 202 does not significantly improve the contrast of the first patterns 201, causing relatively large LWR and LER of side walls of the photoresist layers. As a result, LWR and LER of side walls of the first openings formed by etching the mask material layer 109 according to the photoresist layers subsequently are relatively large. Therefore, LWR and LER of side walls of the target patterns formed by etching the pattern definition layer 101 exposed from the first openings by using the mask layers as masks subsequently are relatively large, and formation quality of the target patterns is poor. If the ratio is excessively small, in the process of exposing the photoresist material layer 110 according to the mask layout 200, to pattern the photoresist material layer 110, the second pattern 202 does not have significant effects of optimizing the pattern density of the first patterns, and correspondingly the second pattern 202 does not have significant effects of improving the contrast of the first patterns 201, causing relatively large LWR and LER of side walls of the photoresist layers. As a result, LWR and LER of side walls of the first openings formed by etching the mask material layer 109 according to the photoresist layers subsequently are relatively large. Therefore, LWR and LER of side walls of the target patterns formed by etching the pattern definition layer 101 exposed from the first openings using the mask layers as masks subsequently are relatively large, and formation quality of the target patterns is poor. In this form, in the step of providing a mask layout 200, a ratio of the lateral dimension of the second pattern 202 to the lateral dimensions of the first patterns 201 is ⅓ to 1.

As shown in FIG. 12, the photoresist material layer 110 is patterned according to the mask layout 200, to form photoresist layers 111.

In this form of this application, in the process that the photoresist material layer 110 is patterned according to the mask layout 200, to form photoresist layers 111, the second pattern 202 can optimize the pattern density of the first patterns 201, and improve the contrast of the first patterns 201, so that LWR and LER of side walls of the photoresist layers 111 are relatively small. Therefore, in the subsequent process that the mask material layer 109 is etched using the photoresist layers 111 as masks, to form mask layers, LWR and LER of side walls of the mask layers are relatively small.

The photoresist layers 111 are prepared for subsequent etching of the mask material layer 109.

In this form, the photoresist material layer 110 is exposed according to the mask layout 200 to pattern the photoresist material layer 110, to form photoresist layers 111.

It should be noted that, in the process of patterning the photoresist material layer 110, to form photoresist layers 111, first grooves 301 are formed according to the first patterns 201, and a second groove 302 is formed according to the second pattern 202. That the LWR and the LER of the side walls of the photoresist layers 111 are relatively small means that, LWR and LER of side walls of the first grooves 301 and the second groove 302 are relatively small. Subsequently, the mask material layer 109 exposed from the first grooves 301 is etched, to form first openings, and the mask material layer exposed from the second groove 302 is etched, to form a second opening.

It should be noted that, the mask material layer 109 is subsequently etched using the photoresist layers 111 as masks, to form mask layers. While a filling layer is formed in the second opening, filling spacers are formed on side walls of the mask layers of the first regions I. Lateral dimensions of the first openings are decreased by the filling spacers, and correspondingly, lateral dimensions of target patterns formed by subsequently etching the pattern definition layer exposed from the first openings are relatively small. To make the lateral dimensions of the finally formed target patterns meet process requirements, in the process of providing the mask layout 200, the lateral dimensions of the first patterns 201 are slightly large.

As shown in FIG. 13, the mask material layer 109 is etched using the photoresist layers 111 as masks, to form the mask layers 102, the first openings 103 correspond to the first patterns 201, and the second opening 104 corresponds to the second pattern 202.

Although in the step of forming the mask layers 102 according to the mask layout 200, the second pattern 202 is transferred to form the second opening 104, by forming the filling layer in the second opening 104, the mask that finally etches the pattern definition layer 101 can still be obtained, so that the target patterns formed by using the mask layers 102 and the filling layer as masks meet process requirements, and due to the fact that the LWR and the LER of the side walls of the first openings 103 are relatively small, LWR and LER of the side walls of the corresponding target patterns are relatively small, which is conducive to improving electrical performance of the semiconductor structure.

In this form, the mask material layer 109 is etched using the photoresist layers 111 as masks and a dry etching process, to form mask layers 102. The dry etching process has an anisotropic etching characteristic and relatively good etching profile controllability, which is conducive to enabling the LWR and the LER of the side walls of the first openings 103 to be relatively small and is further conducive to improving removal efficiency of the mask material layer 109. In the step of etching the mask material layer 109 using the dry etching process, the top of the pattern definition layer 101 can be used as an etching stop position, to decrease damage to other film layers.

Figure 14:
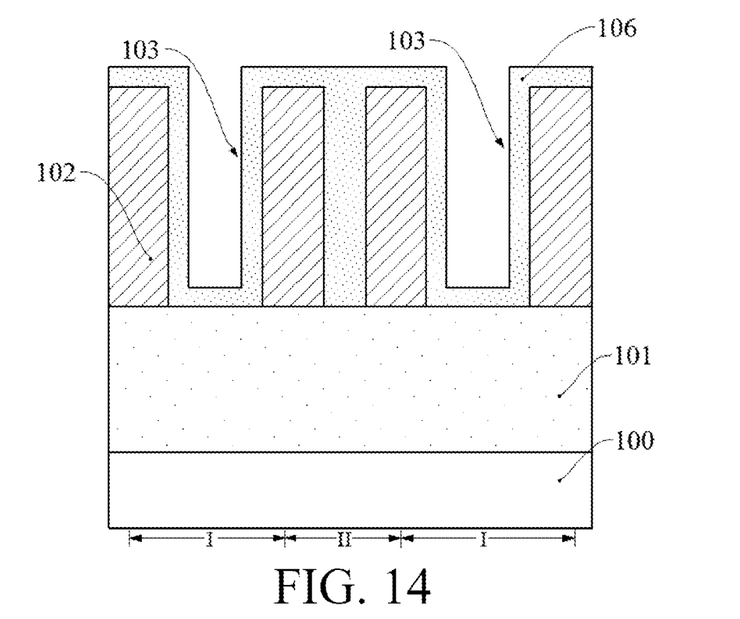
Figure 15:
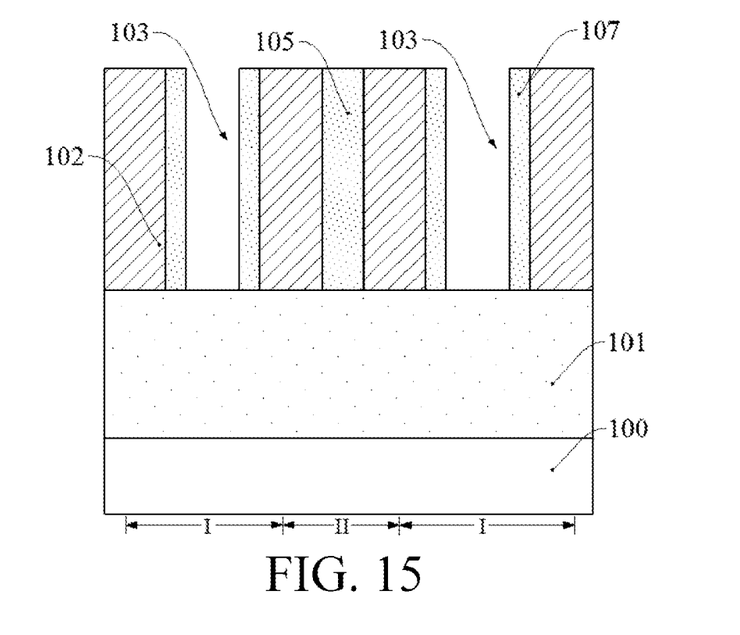

Referring to FIG. 14 and FIG. 15, a filling layer 105 is formed in the second opening 104.

A filling layer 105 is formed between the mask layers 102 of the second region II, and the pattern definition layer 101 is etched using the mask layers 102 and the filling layer 105 as masks subsequently, to form target patterns.

Because LWR and LER of side walls of the mask layers 102 are relatively small, formation quality of the target patterns formed using the mask layers 102 and the filling layer 105 as masks is relatively good, which is conducive to improving electrical performance of the semiconductor structure.

It should be noted that, in the step of forming a filling layer 105 in the second opening 104, filling spacers 107 are further formed on side walls of the first openings 103.

In this form, the filling spacers 107 do not need to be removed. In the subsequent process, the pattern definition layer 101 is etched using the mask layers 102, the filling layer 105, and the filling spacers 107 as masks, to form target patterns, and in the process of providing the mask layout 200, the lateral dimensions of the first patterns 201 are slightly large, the lateral dimensions of the corresponding first openings 103 are slightly large, and the filling spacers 107 play a role in decreasing the lateral dimensions of the first openings 103, so that the finally formed target patterns meet process requirements.

Specifically, the step of forming the filling layer 105 between the mask layers 102 of the second region II includes: conformally covering the mask layers 102 and the pattern definition layer 101 exposed from the mask layers 102 with a filling material layer 106, double of a thickness of the filling material layer 106 being greater than a lateral dimension of the second opening 104; and removing the filling material layer 106 at the bottom of the first openings 103 and the filling material layer 106 located at the top of the mask layers 102, the remaining filling material layer 106 located in the second opening 104 serving as the filling layer 105.

In this form, the filling material layer 106 is formed using an atomic layer deposition (ALD) process. The ALD process is a self-limiting reaction process based on atomic layer deposition. A thin film obtained through deposition may reach a one-atom-layer thickness. Because the ALD process can deposit one atom layer in each cycle precisely, it is conducive to controlling a thickness of the filling material layer 106 precisely by using the ALD process. Furthermore, the filling material layer 106 prepared using the ALD process has characteristics, for example, good bonding strength, thickness consistency of film layers, good component uniformity, and good conformality, which is conducive to improving compactness of the filling material layer 106, and decreasing a void ratio of the filling material layer 106. In other forms, the filling material layer may alternatively be formed by using a chemical vapor deposition (CVD) process.

In this form, the filling material layer 106 at the bottom of the first openings 103 and the filling material layer 106 located at the top of the mask layers 102 are removed using a blanket dry etching process. A mask can be saved using the blanket dry etching process for removal, decreasing process costs for forming the filling layer 105. In addition, the blanket dry etching process has the characteristic of anisotropic etching, which is conducive to ensuring that while the filling material layer 106 on the surface of the pattern definition layer 101 and at the top of the mask layers 102 are completely removed, lateral etching is not easy to be caused to the filling material layer 106 on the side walls of the mask layers 102. Therefore, formation quality of the corresponding filling spacers 107 is relatively good, and formation quality of the target patterns formed by subsequently etching the pattern definition layer 101 by using the filling spacers 107, the filling layer 105, and the mask layers 102 as masks is relatively good.

Specifically, in the process of removing the filling material layer 106 at the bottom of the first openings 103 and the filling material layer 106 located at the top of the mask layers 102, the remaining filling material layer 106 located on the side walls of the mask layers 102 in the first regions I serves as the filling spacer 107.

Figure 16:
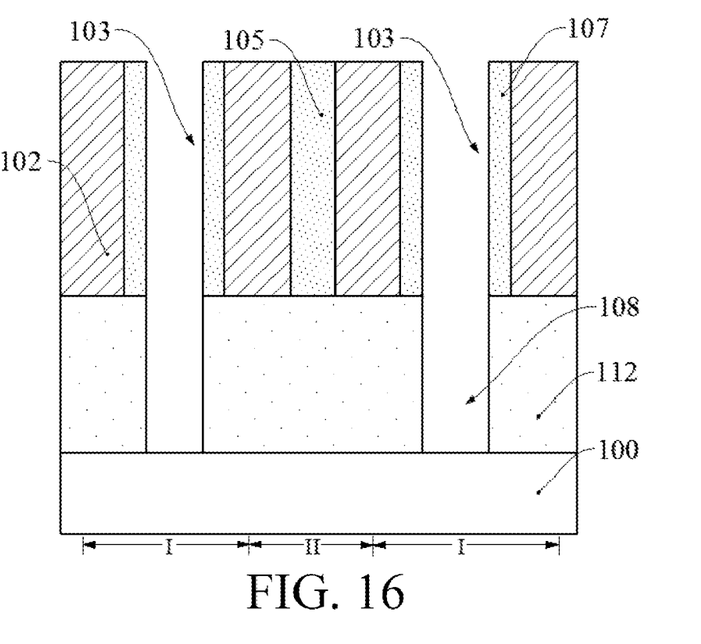

Referring to FIG. 16, the pattern definition layer 101 exposed from the first openings 103 is etched by using the mask layers 102 and the filling layer 105 as masks, to form target patterns 108.

In this form, in the step of forming the target patterns 108, the remaining pattern definition layer 101 serves as remaining patterns 112, and the target patterns 108 are used for separating adjacent remaining patterns 112. Specifically, the remaining patterns 112 are fins. In other forms, the target patterns may be further dummy gate structures. In some other forms, the remaining patterns may be further a low-k dielectric material.

In this form, the pattern definition layer 101 is etched using the mask layers 102 and the filling layer 105 as masks and a dry etching process, to form the target patterns 108. The dry etching process has an anisotropic etching characteristic and relatively good etching profile controllability, which is conducive to enabling the morphology of the target pattern 108 to meet the process requirements and is further conducive to improving the removal efficiency of the pattern definition layer 101. In the process of etching the pattern definition layer 101 using the dry etching process, the top of the base 100 can be used as an etching stop position, to decrease damage to other film layers.

Specifically, in the step of etching, by using the mask layers 102 and the filling layer 105 as masks, the pattern definition layer 101, to form target patterns 108, the pattern definition layer 101 is further etched by using the filling spacers 107 as masks, to form the target patterns 108.

Although the present disclosure is described above, the present disclosure is not limited thereto. A person skilled in the art may make various changes and modifications without departing from the spirit and scope of the present disclosure. Therefore, the protection scope of the present disclosure should be subject to the scope defined by the claims.

What is claimed is:

1. A method for forming a semiconductor structure, comprising:
   providing a base, wherein the base comprises first regions and a second region located between the first regions;
   forming a pattern definition layer on the base;
   forming discrete mask layers on the pattern definition layer, the mask layers and the base defining openings, where the openings of the first regions serve as first openings, and an opening of the second region serves as a second opening;
   forming a filling layer in the second opening; and
   etching, using the mask layers and the filling layer as masks, the pattern definition layer exposed from the first openings, to form target patterns.

2. The method for forming the semiconductor structure according to claim 1, wherein:
   in the step of forming the discrete mask layers on the pattern definition layer, an extension direction parallel to a surface of the base and perpendicular to the mask layers is used as a lateral direction; and
   the step of forming a filling layer in the second opening comprises:
      conformally covering the mask layers and the pattern definition layer exposed from the mask layers with a filling material layer, where double a thickness of the filling material layer is greater than a lateral dimension of the second opening; and
      removing the filling material layer at a bottom of the first openings and the filling material layer located at a top of the mask layers, where the remaining filling material layer located in the second opening serves as the filling layer.

3. The method for forming the semiconductor structure according to claim 2, wherein the filling material layer is formed using an atomic layer deposition (ALD) process or a chemical vapor deposition (CVD) process.

4. The method for forming the semiconductor structure according to claim 2, wherein the filling material layer at the bottom of the first openings and the filling material layer located at the top of the mask layers are removed using a blanket dry etching process.

5. The method for forming the semiconductor structure according to claim 1, wherein:
   in the step of forming the filling layer in the second opening, filling spacers are further formed on side walls of the first openings; and
   in the step of etching, using the mask layers and the filling layer as masks, the pattern definition layer exposed from the first openings, to form target patterns, the pattern definition layer is further etched using the filling spacers as masks.

6. The method for forming the semiconductor structure according to claim 1, wherein in the step of forming the discrete mask layers on the pattern definition layer, there is one second opening, or there is a plurality of second openings.

7. The method for forming the semiconductor structure according to claim 1, wherein the step of forming the discrete mask layers on the pattern definition layer comprises:
   forming a mask material layer on the pattern definition layer;
   forming a photoresist material layer on the mask material layer;
   providing a mask layout, the mask layout comprising first mask regions and a second mask region located between the first mask regions, the first mask regions having first patterns, and the second mask region having a second pattern;
   patterning the photoresist material layer according to the mask layout, to form photoresist layers; and
   etching the mask material layer using the photoresist layers as masks, to form the mask layers, the first openings corresponding to the first patterns, and the second opening corresponding to the second pattern.

8. The method for forming the semiconductor structure according to claim 7, wherein in the step of providing the mask layout, an extension direction perpendicular to the second pattern is used as a lateral direction, and a lateral dimension of the second pattern is less than lateral dimensions of the first patterns.

9. The method for forming the semiconductor structure according to claim 7, wherein in the step of providing the mask layout, a ratio of the lateral dimension of the second pattern to the lateral dimensions of the first patterns is ⅓ to 1.

10. The method for forming the semiconductor structure according to claim 7, wherein in the extension direction of the second pattern, the second pattern is a continuous pattern.

11. The method for forming the semiconductor structure according to claim 7, wherein an extension direction of the first patterns is the same as the extension direction of the second pattern.

12. The method for forming the semiconductor structure according to claim 11, wherein dimensions of the first patterns in the extension direction are less than or equal to a dimension of the second pattern in the extension direction.

* * * * *